United States Patent [19]

Verlinden et al.

[11] Patent Number: 5,448,325
[45] Date of Patent: Sep. 5, 1995

[54] PHOTOGRAPHIC DEVELOPMENT APPARATUS

[76] Inventors: Bartholomeus Verlinden; Jan Claes, both c/o Agfa-Gevaert N.V., Septestraat 27; Marc Scheerders, 46, c/o Agfa-Gevaert N.V., Septestraat 27, all of B 2640 Mortsel, Belgium

[21] Appl. No.: 102,222

[22] Filed: Aug. 5, 1993

[30] Foreign Application Priority Data

Aug. 11, 1992 [EP]  European Pat. Off. ........... 92202462

[51] Int. Cl.⁶ ............................................ G03D 13/00
[52] U.S. Cl. .................................... 354/298; 355/311
[58] Field of Search ............... 354/298, 319, 320, 321;
226/199; 355/311, 66, 55, 56, 308, 309; 271/226

[56] References Cited

U.S. PATENT DOCUMENTS

| | | | |
|---|---|---|---|
| 4,272,185 | 6/1981 | Arai et al. | 354/319 |
| 4,647,239 | 3/1987 | Maezawa et al. | 226/199 |
| 4,935,771 | 6/1990 | Ito | 355/66 |
| 4,947,049 | 8/1990 | Backus | 354/298 X |
| 5,138,353 | 8/1992 | Ohba et al. | 354/322 |

*Primary Examiner*—D. Rutledge
*Attorney, Agent, or Firm*—William J. Daniel

[57] ABSTRACT

Apparatus for processing rectangular sheets of photographic material in varying format sizes is equipped to calculate at least approximately the surface area of the sheets fed therethrough. For this purpose, the apparatus includes a sensor for determining a dimension, e.g. the length, of each sheet, a memory for storing the length and width dimensions of a plurality of sheet format sizes, and a control unit which compares the determined dimension of a sheet with the dimensions stored in the memory and upon finding a match therebetween gives an output signal indication of the surface area of the sheet. If more than one match is found, the unit gives an output signal corresponding to the largest format size having a dimension equal to the determined dimension. If no match is found by the control unit, the unit is adapted to give an output signal equal to the multiple of the determined dimension and the largest of the stored width dimensions or, alternatively, an output signal corresponding to a format size having a length greater than the determined dimension. The surface area indications can be used to regulate the replenishment of processing liquid consumed during processing.

16 Claims, 1 Drawing Sheet

PHOTOGRAPHIC DEVELOPMENT APPARATUS

BACKGROUND OF THE INVENTION

1. Field of Invention

This invention relates to apparatus for the development of exposed photographic material, and in particular to apparatus for developing lithographic offset printing plates.

2. Description of the Prior Art

In an apparatus or system for the development of aluminium lithographic printing plates of the type disclosed in EP-A-410500 it is advantageous to maintain the strength of the processing liquids within specified limits so as to achieve consistent high quality printing plates, and reduce waste products.

This can be achieved by constantly topping up a process liquid reservoir or bath by automatic means as photographic material is processed and the both chemicals are consumed.

The exhaustion of the chemicals in the baths can normally be directly correlated with the amount of processed material passing through the apparatus. This in turn is directly related to the surface area of the material being processed.

A known surface area detection means comprises one sensor for sensing the length of processed material, and an array of sensors to determine the width of the material. Such a system is relatively expensive since to measure random material widths with precision requires a large number of sensors. For example, offset printing plates may vary in width from 225 mm to 800 mm and if it is necessary to measure all possible combinations of standard material widths from 200 mm upwards within a 10% accuracy range some 30 sensors are necessary, and within a 20% accuracy range some 16 sensors are necessary.

Another known surface area detection means is disclosed in JP-A-4 166 935 (Fuji Photo Film Co. Ltd.). This system likewise comprises one sensor for sensing the length of processed material. The width size of the material is determined on the basis of a previously set ratio of length to width in the processing direction of the photosensitive material. It is clear that this system will work satisfactorily only if all the different sheet formats being processed have (nearly) the same ratio of length to width, and if all the sheets are being processed lengthwise. On the contrary, if a sheet is being processed widthwise, the length sensor will errorneously consider a smaller dimension, in accordance with the set ratio, as being the width belonging to the measured "length". Also, the use of the ratio length to width for the control of the replenishment forms a serious limitation of the number of sheet formats that can be used in the apparatus.

SUMMARY OF THE INVENTION

Object of Invention

The present invention provides a simple means of calculating the surface area of the processed material which is suitable for a selection of sheets of multiple formats. The invention aims further to provide a means of calculating the surface area of a processed material which operates independently from whether the sheet is transported lengthwise or widthwise through a processor.

Statement of Invention

Accordingly there is provided apparatus for the development of exposed photographic sheet material which includes a device for the calculation of the surface area of rectangular photograhpic sheet material processed, said device comprising a sensor for determining one linear dimension of the material, memory means for storing information relating to the dimensions (i.e. length as well as width) of given formats of rectangular sheets of material to be processed in the apparatus, control means for comparing a measured dimension with said stored dimensions, and producing a signal indicative of a surface area when there is a match between a stored dimension and measured dimension.

Preferably the apparatus is for the processing of exposed aluminium lithographic offset printing plates. Offset printing plates are never supplied in exact standard A1, A2, A3, etc., formats having a constant ratio of length to width since the plate is always larger than the paper format in the length direction to enable the plate to be secured around a printing drum. However, in the event that the sensor measures a dimension which is exactly the same as a stored dimension given in two or more format sizes, then the comparator means produces a signal indicative of the largest sheet format containing said dimension.

Preferably the apparatus includes a sheet feed means, and a feed sensor which senses when the sheet is substantially centralised relative to the sheet feed means, the feed sensor being operable to prevent the operation of the feed sheet means if the presence of a sheet is not sensed.

Also according to the invention there is provided a further apparatus for the development of exposed photographic sheet material, said apparatus including a sheet feed means that is driven through a clutch means, the clutch means being controlled by at least one sensor which senses a process parameter so that the feed means is operable only when a desired value of process parameter is reached.

BRIEF DESCRIPTION OF THE DRAWINGS

The invention will be described by way of example and with reference to the accompanying drawings in which.

DETAILED DESCRIPTION OF THE INVENTION

Figures 1, 2:
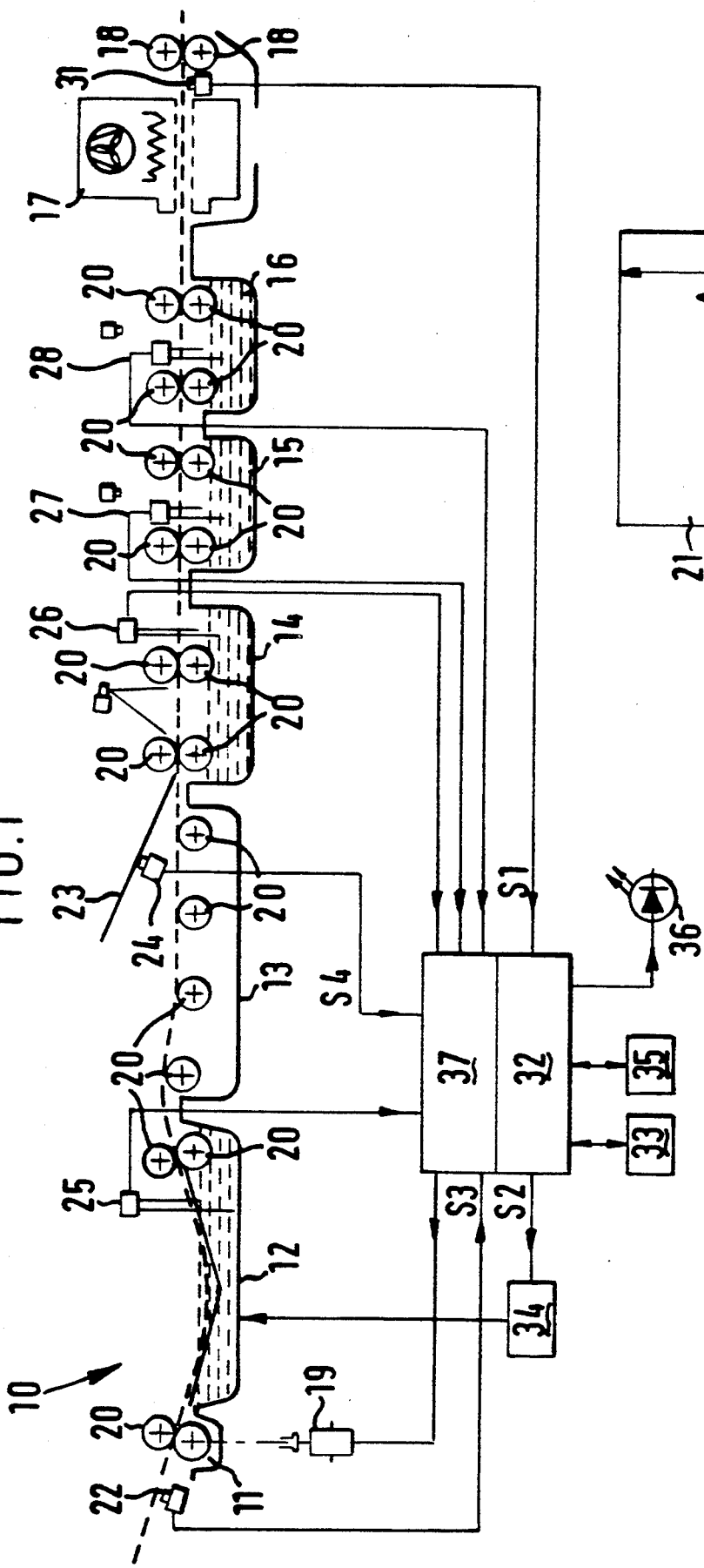
FIG. 1 is a schematic layout of one embodiment of a processing apparatus according to the invention.
FIG. 2 is a plan view of a sheet of material which is processed by the apparatus.

With reference to FIG. 1 there is illustrated a longitudinal cross-section through an apparatus 10 for processing exposed photographic sheet material, in particular aluminium lithographic printing plates, of the type described in EP-A-410500.

EP-A-410500 discloses an imaging element containing an aluminium support provided with in the order given an image receiving layer and a photosensitive layer containing a silver halide emulsion. In the document there is disclosed a diffusion transfer reversal process (hereinafter called DTR-process) for obtaining a lithographic printing plate in which said imaging element is image-wise exposed and subsequently developed using a developing liquid or activating liquid in the presence of a silver halide complexing agent. The imaging element is then guided through a diffusion transfer zone so that the silver halide complexes formed during the development step are allowed to diffuse into the image-receiving layer where they are converted to silver. When the imaging element leaves the diffusion transfer zone a silver image is formed in the image receiving layer. The now useless photosensitive layer and optional other layers above the image receiving layer are then removed by rinsing the imaging element in a washing section. Finally the element now carrying a silver image on its surface is treated with a finishing liquid that contains a so called hydrophobizing agent for improving the hydrophobicity of the silver image.

In the above described method for obtaining an aluminium based lithographic printing plate according to the DTR-process, generally three different liquids are used i.e. a developing or activating liquid, a rinsing liquid and a finishing liquid.

The apparatus 10 is mounted within a generally rectangular housing which may include a rectangular metal frame (not shown) for supporting the various parts of the apparatus.

The apparatus comprises a sheet feed means 11, preferably a pair of rollers 20, a developing section 12, a diffusion transfer section 13, a wash section 14, a rinse section 15, a finishing section 16, a drier 17, and output rollers 18. All these sections are linked by a single drive screw so that all the sections' rollers 20 can operate simultaneously at the same speed.

Now in use the developing liquid, rinsing liquid and finishing liquid may be automatically replenished, however, for simplicity the present apparatus will only be described with reference to the replenishment of the developing liquid or activating liquid in the developing section.

A typical aluminium sheet or plate 21 is shown in FIG. 2, and has basically a width A and a length B. These sizes A & B are loosely based on standard A1, A2, A3, etc., formats and will have maximum dimensions of about 80 cms width A, and 1.10 meter length B. As the plate 21 passes through the apparatus 10, the consumption of the chemicals in the various sections 12, 15, 16, directly relates to the area of the plate. The image on the plate generally involves about 10%–25% of the area of the plate and therefore the correlation between chemical consumption and area of the plate 21 passing through the apparatus is good.

In order to measure the area of sheet material passing through the apparatus, a length sensor 31 is preferably arranged at a position where the velocity of the processed sheet through the apparatus is constant. A suitable position is at the output end of the apparatus between the drier 17 and the output rollers 18.

The sensor 31 can be an optical sensor, a mechanical sensor, or any other suitable device which can determine the length of a passing sheet material.

A signal S1 from the sensor 31 passes to a first controller 32 which can calculate the length of the sheet material from the process speed and the detection time, (i.e. the time the sensor 31 is operating).

The controller 32 compares the dimension measured with pre-programmed dimensions for various formats of sheet material held in memory 33. In the event of the controller 32 matching the measured dimension and a stored dimension a signal S2 is sent to a replenishment means 34 where the signal S2 is utilised to provide automatic replenishment of the developing fluid in accordance with the signal S2.

Aluminium printing plates are not exactly A1, A2, A3, etc., standard sizes and it is therefore unlikely that a given dimension will appear more than once in the memory. However in the event that the measured dimension occurs more than once in the memory, the controller 32 can provide a signal S2 corresponding to the largest plate format containing that dimension.

The dimensions of given sheets of material to be processed could be stored directly into the memory 33, during manufacture, but preferably can be entered into the memory by a user operable unit means 35 such as a key board, or a bar code reader.

In the event that measured length does not correspond with a pre-programmed dimension the system gives an error signal through an alarm 36 such as a light emitting diode, and sends a signal S2 corresponding to a previous counted surface area of a plate format with a length dimension longer than the detected one, or sends a signal S2 corresponding to a surface are equal to the length measured multiplied by the maximum plate width.

In order to achieve optimum processing conditions through the machine, any plates 21 should be roughly centered with respect to the longitudinal centre line of the apparatus.

The following table gives a survey of different plate sizes that were used in an apparatus according to the present invention for covering standard A3, A2 and A1 formats. The differences in plate sizes are explained by differences in the drum mechanisms of the printing presses, by the use of the printed sheets: cutting, folding, etc.

| Format: | A3 | Plate sizes: | 510 × 400 |
|---|---|---|---|
|  |  |  | 450 × 370 |
|  |  |  | 462 × 458 |
|  |  |  | 602 × 398 |
|  | A2 |  | 650 × 550 |
|  |  |  | 660 × 510 |
|  |  |  | 730 × 605 |
|  |  |  | 724 × 615 |
|  |  |  | 650 × 530 |
|  |  |  | 620 × 457 |
|  |  |  | 889 × 586 |
|  | A1 |  | 1030 × 770 |
|  |  |  | 1020 × 820 |
|  |  |  | 1030 × 790 |
|  |  |  | 1045 × 795 |
|  |  |  | 1085 × 745 |
|  |  |  | 915 × 715 |

The plates 21 are fed into the apparatus 10 through a pair of rollers 11 which are driven by a clutch means 19. The clutch means 19 could be a mechanical clutch but is preferably an electromagnetic clutch operated by a clutch control means 37.

The clutch control means 37 is connected to a feed sensor 22 which is located on the longitudinal centre line of the apparatus. The control means 37 operates to control the clutch for rotation of the feed rollers 11 only when the sensor 22 detects that the plate 21 is being fed roughly centrally into the apparatus and sends a signal S3 to the control 37. More positive guide means may also by necessary to centered the plate.

The clutch controller 37 may be programmed to operate a time delay after initial detection of a plate to allow for precise positioning of a plate 21 against static rollers 11.

The apparatus 10 may include a rewash facility 23 for feeding already processed and reworked plates back into the wash section 14. A second feed sensor 24 is located on the rewash facility to sense the presence of plates thereon. A signal S4 will be sent to the clutch control 37 which will prevent the operation of the clutch means 19 thereby preventing the input of plates until the rewashed plate is processed.

The process conditions within the developing section 12, wash section 14, rinse section 15, and finishing section 16 can be monitored by condition sensors 25, 26, 27, and 28 respectively.

In the event that the sensed conditions do not fall within predetermined process parameters the clutch control will prevent operation of the input rollers. In the event that the process conditions return to required value, then the input of the machine will be restored automatically.

The invention is not limited to the embodiment disclosed hereinbefore. The apparatus according to the invention can be used for processing photographic materials other than aluminium lithograhic printing plates, such as printing plates with a polyethylene terephthalate support, and other conventional photographic materials requiring careful control of the replenishment of their processing baths.

The use of the apparatus is not limited to the range of formats mentioned, and the length sensor 31 can be located at other suitable positions on the apparatus where the process velocity is constant e.g. the diffusion section.

We claim:

1. In an apparatus for the processing of generally rectangular sheets in a plurality of different format sizes of exposed photographic material in which said sheets of material are fed one at a time through the apparatus, the improvement of means for substantially calculating the surface area of said sheet material being processed, which means comprises a sensor for determining one linear dimension of each sheet of the material being fed, memory means for storing the length and width dimensions of a plurality of given format sizes of rectangular sheets of said material to be processed in the apparatus, and control means for comparing the dimension determined by said sensor with said stored dimensions and producing a signal indicative of a surface area of a stored format size when there is a match between one of said stored dimensions and said determined dimension, said control means in the event said sensor determines a dimension which is substantially the same as a stored dimension for more than one of said format sizes, producing a signal indicative of the largest sheet format size containing said dimension.

2. Apparatus as claimed in claim 1, in which said sheets of material are fed through at least one region thereof at a generally constant velocity and said sensor is arranged in said region.

3. Apparatus as claimed in claim 1, wherein the apparatus further includes a sheet feed means for feeding said sheets along a generally longitudinal path, and a feed sensor which senses when a sheet of said material is substantially centered relative to the axis of said path, the feed sensor being operable to prevent the operation of the feed means if the presence of a sheet is not sensed by said feed sensor.

4. Apparatus as claimed in claim 1, wherein said sheets of material are fed in the apparatus though at least one bath of processing liquid subject to at least one process parameter and which further comprises at least one further sensor each such further sensor sensing the existence of a process parameter in the apparatus and sheet feed means for feeding the sheets of said material, said feed sheet means being driven through a clutch means, each of said further sensors being operable to disengage said clutch means and render the sheet feed means inoperable if the existence of said process parameter has not been sensed.

5. Apparatus as claimed in claim 1, wherein said photographic sheet material is an aluminum lithographic offset printing plate.

6. In an apparatus for the processing of generally rectangular sheets in a plurality of different format sizes of exposed photographic material in which said sheets of material are fed one at a time through the apparatus, the improvement of means for substantially calculating the surface area of said sheet material being processed, which means comprises a sensor for determining one linear dimension of each sheet of the material being fed, memory means for storing the length and width dimensions of a plurality of given format sizes of rectangular sheets of said material to be processed in the apparatus, and control means for comparing the dimension determined by said sensor with said stored dimensions and producing a signal indicative of a surface area of a stored format size when there is a match between one of said stored dimensions and said determined dimension, said control means in the event there is no match between the stored dimensions and said determined dimension, multiplying the determined dimension by the largest of the stored width dimensions and producing a signal indicative of a surface area corresponding to such multiple.

7. Apparatus as claimed in claim 6, in which said sheets of material are fed through at least one region thereof at a generally constant velocity and said sensor is arranged in said region.

8. Apparatus as claimed in claim 6, wherein the apparatus further includes a sheet feed means for feeding said sheets along a generally longitudinal path, and a feed sensor which senses when a sheet of said material is substantially centered relative to the axis of said path, the feed sensor being operable to prevent the operation of the feed means if the presence of a sheet is not sensed by said feed sensor.

9. Apparatus as claimed in claim 6, wherein said sheets of material are fed in the apparatus through at least one bath of processing liquid subject to at least one process parameter and which further comprises at least one further sensor each such further sensor sensing the existence of a process parameter in the apparatus and sheet feed means for feeding the sheets of said material, said feed sheet means being driven through a clutch means, each of said further sensors being operable to disengage said clutch means and render the sheet feed means inoperable if the existence of said process parameter has not been sensed.

10. Apparatus as claimed in claim 6, wherein said photographic sheet material is an aluminum lithographic offset printing plate.

11. In an apparatus for the processing of generally rectangular sheets in a plurality of different format sizes of exposed photographic material in which said sheets of material are fed one at a time through the apparatus, the improvement of means for substantially calculating the surface area of said sheet material being processed, which means comprises a sensor for determining one linear dimension of each sheet of the material being fed, memory means for storing the length and width dimensions of a plurality of given format sizes of rectangular sheets of said material to be processed in the apparatus, and control means for comparing the dimension determined by said sensor with said stored dimensions and producing a signal indicative of a surface area of a stored format size when there is a match between one of said stored dimensions and said determined dimension, said control means in the event there is no match between the measured dimension and a stored dimension, said control means giving an indication of a surface area corresponding to a sheet material having a format with a length dimension larger than the determined dimension.

12. Apparatus as claimed in claim 11, in which said sheets of material are fed through at least one region thereof at a generally constant velocity and said sensor is arranged in said region.

13. Apparatus as claimed in claim 11, wherein the apparatus further includes a sheet feed means for feeding said sheets along a generally longitudinal path, and a feed sensor which senses when a sheet of said material is substantially centered relative to the axis of said path, the feed sensor being operable to prevent the operation of the feed means if the presence of a sheet is not sensed by said feed sensor.

14. Apparatus as claimed in claim 11, wherein said sheets of material are fed in the apparatus through at least one bath of processing liquid subject to at least one process parameter and which further comprises at least one further sensor each such further sensor sensing the existence of a process parameter in the apparatus and sheet feed means for feeding the sheets of said material, said feed sheet means being driven through a clutch means, each of said further sensors being operable to disengage said clutch means and render the sheet feed means inoperable if the existence of said process parameter has not been sensed.

15. Apparatus as claimed in claim 11, wherein said photographic sheet material is an aluminum lithographic offset printing plate.

16. Apparatus for the development of exposed photographic sheet material according to certain desired process parameters, said apparatus including a sheet feed means for feeding material into the apparatus, the sheet feed means being driven through a clutch means, and at least one sensor each such sensor sensing a process parameter and controlling said clutch means so that the feed means is operable only when the desired processing parameter is sensed by each such sensor.

* * * * *